United States Patent
Baum et al.

(10) Patent No.: US 10,526,697 B2
(45) Date of Patent: Jan. 7, 2020

(54) HIGH-PURITY TUNGSTEN HEXACARBONYL FOR SOLID SOURCE DELIVERY

(71) Applicant: ENTEGRIS, INC., Billerica, MA (US)

(72) Inventors: Thomas H. Baum, New Fairfield, CT (US); Robert L. Wright, Jr., Newtown, CT (US); Scott L. Battle, Cedar Park, TX (US); John M. Cleary, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/556,102

(22) PCT Filed: Feb. 28, 2016

(86) PCT No.: PCT/US2016/019995
§ 371 (c)(1),
(2) Date: Sep. 6, 2017

(87) PCT Pub. No.: WO2016/144579
PCT Pub. Date: Sep. 15, 2016

(65) Prior Publication Data
US 2018/0044787 A1 Feb. 15, 2018

Related U.S. Application Data

(60) Provisional application No. 62/129,368, filed on Mar. 6, 2015.

(51) Int. Cl.
*C01G 41/00* (2006.01)
*C23C 16/16* (2006.01)

(52) U.S. Cl.
CPC .......... *C23C 16/16* (2013.01); *C01G 41/006* (2013.01)

(58) Field of Classification Search
CPC ........ C23C 16/16; C01G 41/00; C01G 41/006
See application file for complete search history.

(56) References Cited

U.S. PATENT DOCUMENTS

2006/0112882 A1* 6/2006 Suzuki .................... C23C 16/16
118/726
2009/0250006 A1* 10/2009 Yamasaki ........... C23C 16/4481
118/726

(Continued)

FOREIGN PATENT DOCUMENTS

CN 1775787 A 5/2006
JP 48-39235 B1 11/1973

(Continued)

OTHER PUBLICATIONS

International Search Report and Written Opinion from International Application No. PCT/US2016/019995, dated Jun. 7, 2016 (7 pages).

(Continued)

*Primary Examiner* — Elizabeth A Burkhart
(74) *Attorney, Agent, or Firm* — Entegris, Inc.

(57) ABSTRACT

A solid source material is described for forming a tungsten-containing film. The solid source material is tungsten hexacarbonyl, wherein content of molybdenum is less than 1000 ppm. Such solid source material may be formed by a process including provision of particulate tungsten hexacarbonyl raw material of particles of size less than 5 mm, wherein particles of size greater than 1.4 mm are less than 15% of the particles, and wherein content of molybdenum is less than 1000 ppm, and sintering the particulate tungsten hexacarbonyl raw material at temperature below 100° C. to produce the solid source material as a sintered solid.

18 Claims, 5 Drawing Sheets

(56) References Cited

U.S. PATENT DOCUMENTS

2012/0153012 A1\* 6/2012 Schafer ................ B22F 1/0062
  228/248.1
2015/0303040 A1\* 10/2015 Kaminaga ................ B22F 3/15
  420/430

FOREIGN PATENT DOCUMENTS

| JP | 2002249455 A | 9/2002 |
| JP | 2003-055758 A | 2/2003 |
| JP | 2007-211346 A | 8/2007 |
| JP | 2013091852 A | 5/2013 |
| KR | 20060046691 A | 5/2006 |
| KR | 20070089785 A | 9/2007 |
| WO | 2006/057710 A1 | 6/2006 |
| WO | 2014/052642 A1 | 4/2014 |

OTHER PUBLICATIONS

Kunchan Lee et al. Electrochemistry Communications. 2007, vol. 9, pp. 1704-1708 (Mar. 31, 2007).

\* cited by examiner

HIGH-PURITY TUNGSTEN HEXACARBONYL FOR SOLID SOURCE DELIVERY

CROSS-REFERENCE TO RELATED APPLICATION

The present application is a National Stage Entry of International Application No. PCT/US2016/019995, filed on Feb. 28, 2016, which also claims the benefit under 35 USC 119 of U.S. Provisional Patent Application 62/129,368 filed Mar. 6, 2015 in the names of Thomas H. Baum, Robert L. Wright, Jr., Scott L. Battle, and John M. Cleary for HIGH-PURITY TUNGSTEN HEXACARBONYL FOR SOLID SOURCE DELIVERY. The disclosure of both applications are hereby incorporated herein by reference, in their entireties, for all purposes.

FIELD

The present disclosure relates to a solid source material for forming a tungsten-containing film, as well as processes for making and using such solid source material, and packages for supplying such solid source material, e.g., for the metallization of large-scale integrated circuits.

DESCRIPTION OF THE RELATED ART

In the manufacture of large-scale integrated circuits, the art continues to seek improved metallization reagents and processes. Tungsten has been utilized in such applications as a metallization material, e.g., as a plug filling medium for interlayer connections, as a result of its good electrical conductivity, high melting point, and high electric migration durability.

The conventional tungsten source reagent for such applications has been tungsten hexafluoride ($WF_6$). Tungsten hexafluoride, while generally useful as a precursor, has associated deficiencies that have motivated a search for alternative tungsten source reagents. These deficiencies of tungsten hexafluoride include interfacial consumption of silicon and corrosion of microelectronic devices deriving from hydrogen fluoride produced as a byproduct gas in the deposition of tungsten from tungsten hexafluoride.

It is correspondingly desirable to provide new solid source materials for tungsten, which avoid the aforementioned deficiencies, and which exhibit good volatilization, transport and deposition properties for use in vapor deposition processes such as chemical vapor deposition (CVD) and atomic layer deposition (ALD).

Solid source materials are increasingly being used for ALD and CVD processes. Solid sources pose significant challenges in providing consistent delivery of the source material to the process chamber. In specific, particle size, particle size distribution, surface area, purity and surface pre-treatment may be critical in achieving consistent delivery and gas-phase source material concentration. Changes in the aforementioned variables can impact source material performance and process repeatability.

It would therefore be a significant advance in the art to provide a tungsten solid source material having superior properties in the context of the foregoing considerations.

SUMMARY

The present disclosure relates to a solid source material for forming a tungsten-containing film, as well as processes for making and using such solid source material, and packages for supplying such solid source material.

In one aspect, the disclosure relates to a solid source material for forming a tungsten-containing film, which is tungsten hexacarbonyl, wherein content of molybdenum is less than 1000 ppm.

In another aspect, the disclosure relates to a process for forming a solid source material for forming a tungsten-containing film, comprising: providing particulate tungsten hexacarbonyl raw material of particles of size less than 5 mm, wherein particles of size greater than 1.4 mm are less than 15% of the particles, and wherein content of molybdenum is less than 1000 ppm; and sintering the particulate tungsten hexacarbonyl raw material at temperature below 100° C. to produce the solid source material for forming a tungsten-containing film, as a sintered solid.

In a further aspect, the disclosure relates to a method of forming a tungsten-containing film on a substrate, comprising volatilizing a solid source material of the present disclosure, to form a tungsten precursor vapor, and contacting the tungsten precursor vapor with a substrate under vapor deposition conditions, to form the tungsten-containing film on the substrate.

A further aspect of the disclosure relates to a process of forming a microelectronic device, comprising metallizing the device or a precursor structure thereof by the method described above.

A still further aspect of the disclosure relates to a tungsten solid source material supply package, comprising a vessel containing a solid source material of the present disclosure.

Other aspects, features and embodiments of the disclosure will be more fully apparent from the ensuing description and appended claims.

DETAILED DESCRIPTION

Figure 1:
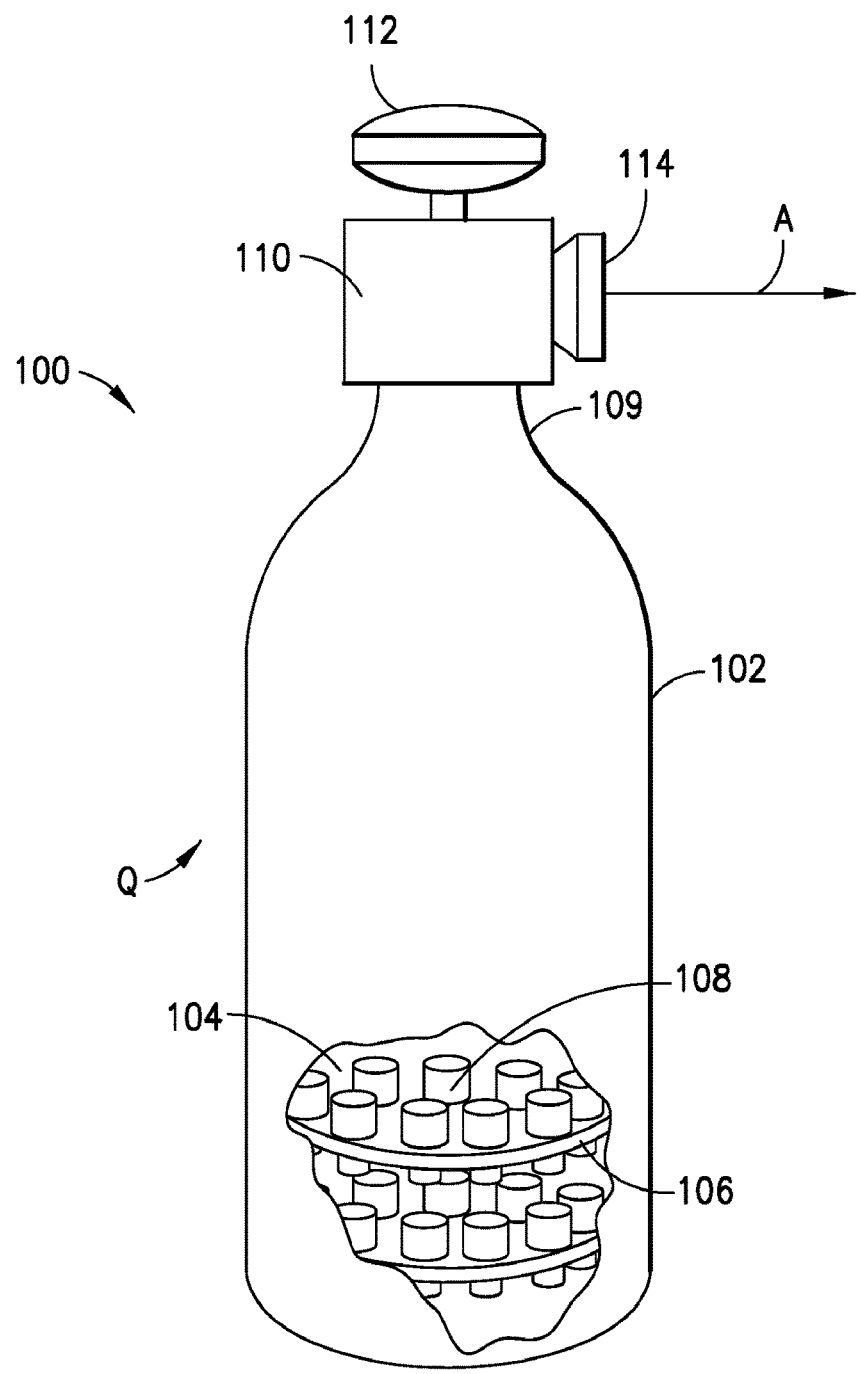
FIG. 1 is a schematic representation of a material storage and dispensing package containing a tungsten solid source material, according to one embodiment of the present disclosure.

The present disclosure relates to a solid source material for forming a tungsten-containing film, as well as processes for making and using such solid source material, and packages for supplying such solid source material.

As used herein and in the appended claims, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure.

As used herein, the term "film" refers to a layer of deposited material having a thickness below 1000 micrometers, e.g., from such value down to atomic monolayer thickness values. In various embodiments, film thicknesses of deposited material layers in the practice of the disclosure may for example be below 100, 10, or 1 micrometer(s), or in various thin film regimes below 200, 10 or 1 nanometer(s), depending on the specific application involved. As used herein, the term "thin film" means a layer of a material having a thickness below 1 micrometer, however it will be recognized that cobalt-containing material in the broad practice of the present disclosure may have any suitable thickness for the application that is involved.

As used herein, the term "ppm" means parts-per-million by weight in reference to a specified material.

The disclosure in one aspect relates to a solid source material for forming a tungsten-containing film, which is tungsten hexacarbonyl, wherein content of molybdenum is less than 1000 ppm.

Such solid source material may be a sintered solid source material, e.g., a cold-sintered solid source material that is prepared by cold sintering involving consolidation of a particulate solid source material under applied pressure without heating. Alternatively, the sintering may be carried out with heating and applied pressure, to consolidate a particulate solid source material to form a sintered solid source material.

The solid source material of the disclosure may have a molybdenum content in various embodiments that is less than 500 ppm, less than 300 ppm, less than 100 ppm, less than 10 ppm, less than 5 ppm, less than 1 ppm, or any other suitable purity.

In a specific embodiment, the solid source material is a sintered material consolidated from particulate raw material of particles of size less than 5 mm, wherein particles of size greater than 1.4 mm are less than 15% of the particles. The particulate raw material particles may be of any suitable character, e.g., with particles of size 0.25 mm to 1.4 mm being at least 50%, 70%, or more of the particles, in various specific embodiments of the disclosure. In other embodiments, at least 80% of the particulate raw material particles may be particles of size below 0.25 mm.

The disclosure in another aspect relates to a process for forming a solid source material for forming a tungsten-containing film, comprising: providing particulate tungsten hexacarbonyl raw material of particles of size less than 5 mm, wherein particles of size greater than 1.4 mm are less than 15% of the particles, and wherein content of molybdenum is less than 1000 ppm; and sintering the particulate tungsten hexacarbonyl raw material at temperature below 100° C. to produce the solid source material for forming a tungsten-containing film, as a sintered solid.

The sintering in such process may involve consolidation under heat and/or pressure of raw material particles, e.g., cold sintering in which pressure is employed to consolidate the raw material particles, without application of heating of such raw material particles.

The content of molybdenum in the particulate tungsten hexacarbonyl raw material in various embodiments may be less than 500 ppm, less than 300 ppm, less than 100 ppm, less than 10 ppm, less than 5 ppm, less than 1 ppm, or any other suitable purity.

The particles of the particulate tungsten hexacarbonyl raw material in various embodiments may be less than 5 mm in size. The particles may be of any suitable particle size distribution, e.g., wherein particles of size greater than 1.4 mm are less than 15% of the particles, and/or wherein particles of size 0.25 mm to 1.4 mm are at least 50%, 70%, 75% or more of the particles, in various specific embodiments of the disclosure. In other embodiments, at least 80% of the particulate raw material particles may be particles of size below 0.25 mm.

The disclosure in another aspect relates to a method of forming a tungsten-containing film on a substrate, comprising volatilizing a solid source material of the present disclosure, to form a tungsten solid source material vapor, and contacting the tungsten solid source material vapor with a substrate under vapor deposition conditions, to form the tungsten-containing film on the substrate.

In such method, the contacting may be carried out at any suitable temperature, e.g., temperature below 200° C., 150° C., 100° C., or other temperature, and at any suitable pressure.

The disclosure in a further aspect relates to a process of forming a microelectronic device, comprising metallizing the device or a precursor structure thereof by a method of the disclosure, as described above.

A further aspect of the disclosure relates to a.tungsten solid source material supply package, comprising a vessel containing a solid source material of the present disclosure. The tungsten solid source material package may for example comprise a vaporizer package of a type commercially available from Entegris, Inc. (Billerica, Mass., USA) under the trademark ProE-Vap, or other suitable vaporizer, in which the solid source material may be volatilized to form corresponding solid source material vapor that then is transported by suitable flow circuitry to a deposition chamber in which the solid source material vapor is contacted with a substrate to deposit tungsten thereon, either as elemental metal or as tungsten-containing material, e.g., tungsten nitride, tungsten oxide, tungsten oxynitride, depending on the composition of the precursor vapor and the ambient environment under which the deposition is carried out.

Accordingly, the present disclosure contemplates a vapor deposition process in which a tungsten solid source material of the disclosure is volatilized, transported to the deposition zone, and contacted with a substrate to deposit tungsten-containing material thereon.

In various embodiments, the solid source material precursor can be employed in a deposition process in which the deposition conditions include a temperature of less than 300° C., e.g., temperature in a range of from 50° C. to 200° C.

In other embodiments, the disclosure contemplates the formation of a nucleation layer comprising tungsten, by a deposition process including co-reactants such as ammonia or hydrogen, to form a corresponding tungsten nitride film or an elemental tungsten film, or both ammonia and hydrogen may be employed as a gas mixture that is flowed to the deposition chamber, e.g., either separately or in further mixture with the solid source material vapor, to carry out the deposition and form a tungsten-containing film of desired character. The nucleation layer thickness in various embodiments may be less than 100 Å, or any other suitable thickness compatible with the subsequent deposition on the nucleation layer.

The vapor deposition process in which the tungsten solid source material of the present disclosure is utilized to deposit tungsten-containing material on a substrate may be of any suitable type. Potential vapor deposition processes that may be used in various implementations of the present disclosure include, without limitation, chemical vapor deposition (CVD), atomic layer deposition (ALD), pseudo-ALD, pulsed CVD, and plasma-enhanced or plasma-assisted CVD.

In a specific embodiment, tungsten is deposited by a solid delivery vapor deposition process using tungsten solid source material of the disclosure, and a hydrogen source. The hydrogen source may be ammonia, hydrogen, hydrogen plasma, ammonia plasma, a mixture of hydrogen and ammonia in plasma or non-plasma form, or a remote plasma hydrogen source. The tungsten may be deposited on a substrate over a suitable base layer (glue layer), e.g., of TiN, WN, TaN, TiAlN, TaAlN, TiTaN, etc.

The disclosure also contemplates forming a WN layer on a substrate, as a seed layer in situ, prior to tungsten deposition. The tungsten nitride layer may be formed on a glue layer such as titanium nitride, tantalum nitride, titanium aluminum nitride, or the like. Alternatively, the tungsten nitride layer may be formed directly on the substrate without any glue layer.

It will therefore be appreciated that the disclosure contemplates a wide variety of techniques and implementations for the deposition of tungsten-containing material on a substrate, in a film of any suitable thickness, e.g., a thin film.

The disclosure correspondingly contemplates a method of manufacturing a microelectronic device, comprising metallizing a substrate with tungsten metallization from a tungsten solid source material of the present disclosure, wherein the metallization is in the form of elemental tungsten or a tungsten composition (e.g., a tungsten alloy or other tungsten compound). Such metallizing may be utilized to provide interconnect structures, word or bit lines, or other structures of the microelectronic device or device precursor.

Tungsten solid source material of the present disclosure can be readily prepared within the skill of the art, based on the disclosure herein. The purification of the tungsten solid source raw material may be realized by fractional repeated sublimation of the solid, recrystallization of the solid product from an organic solvent and/or use of column chromatography with an organic solvent, followed by isolation of the product.

Referring now to the drawings, FIG. 1 is a schematic representation of a tungsten solid source material storage and dispensing package 100 containing a tungsten solid source material, according to one embodiment of the present disclosure.

The solid source material storage and dispensing package 100 includes a vessel 102 that may for example be of generally cylindrical shape as illustrated, defining an interior volume 104 therein. In this embodiment, the tungsten solid source material is a solid at ambient temperature conditions, and such solid source material may be supported on surfaces of the trays 106 disposed in the interior volume 104 of the vessel, with the trays having flow passage conduits 108 associated therewith, for flow of vapor upwardly in the vessel to the valve head assembly, for dispensing in use of the vessel.

The solid source material is supported on interior surfaces in the interior volume of the vessel, e.g., on the surfaces of the trays 106 and conduits 108. The solid source material may be introduced to the interior volume of the vessel in any suitable manner, and the solid source material may be sintered in situ in the vessel after introduction thereto of the solid source particulate raw material. The in situ sintering may comprise cold sintering, or it may involve consolidation of particulate raw solid source material with both heat and pressure being applied to the particulate raw material, or with heat alone being applied.

The vessel 102 has a neck portion 109 to which is joined the valve head assembly 110. The valve head assembly is equipped with a hand wheel 112 in the embodiment shown, but may alternatively employ a valve head assembly including an automatic valve actuator such as a pneumatic valve actuator. The valve head assembly 110 includes a dispensing port 114, which may be configured for coupling to a fitting or connection element to join flow circuitry to the vessel. Such flow circuitry is schematically represented by arrow A in FIG. 1, and the flow circuitry may be coupled to a downstream ALD or chemical vapor deposition chamber (not shown in FIG. 1).

In use, the vessel 102 is heated, such input of heat being schematically shown by the reference arrow Q, so that solid source material in the vessel is at least partially volatilized to provide solid source material vapor. The solid source material vapor is discharged from the vessel through the valve passages in the valve head assembly 110 when the hand wheel 112 is translated to an open valve position, whereupon vapor deriving from the precursor is dispensed into the flow circuitry schematically indicated by arrow A.

It will be recognized that the tungsten solid source material of the present disclosure may be packaged in a variety of suitable vessels for dispensing of solid source material to a downstream precursor-utilizing process tool or facility.

The features and advantages of the present disclosure are more fully shown by the following non-limiting examples.

EXAMPLE I

Tungsten hexacarbonyl vaporization tests were carried out, to assess the tungsten hexacarbonyl solid source material.

A thermopile infrared (TPIR) detector was employed to monitor vapor generated in the operation of vaporizer ampoules containing tungsten hexacarbonyl material. The TPIR detector utilized a 1 meter linear cell and was configured with a reference channel, a channel for "free" carbon monoxide (CO), a channel for carbon dioxide ($CO_2$), and a channel for CO coordinated to a metal center at 5.0 microns to enable detection of both $W(CO)_6$ and $Mo(CO)_6$ in the 5.0 micron filtered channel.

A first vaporizer vessel, denoted NSI ampoule #1, was operated with particulate tungsten hexacarbonyl material having a particle size distribution shown in Table 1 below.

TABLE 1

| Bin Size (mm) | Test 1 (g) | Test 1 (%) | Test 2 (g) | Ave (g) | Ave (%) |
|---|---|---|---|---|---|
| >1.4 | 20.18 | 19.50 | 20.25 | 20.22 | 19.59 |
| 1.0-1.4 | 14.39 | 13.91 | 14.09 | 14.24 | 13.80 |
| 0.71-1.0 | 18.74 | 18.11 | 18.46 | 18.60 | 18.03 |
| 0.50-0.71 | 15.69 | 15.16 | 16.01 | 15.85 | 15.36 |

TABLE 1-continued

| Bin Size (mm) | Test 1 (g) | Test 1 (%) | Test 2 (g) | Ave (g) | Ave (%) |
|---|---|---|---|---|---|
| 0.25-0.50 | 21.58 | 20.86 | 21.98 | 21.78 | 21.11 |
| 0.106-0.25 | 11.09 | 10.72 | 10.48 | 10.79 | 10.45 |
| <0.106 | 1.00 | 1.74 | 1.00 | 1.70 | 1.65 |
| | 103.47 | | 102.87 | 103.17 | 100.00 |

Figure 2:
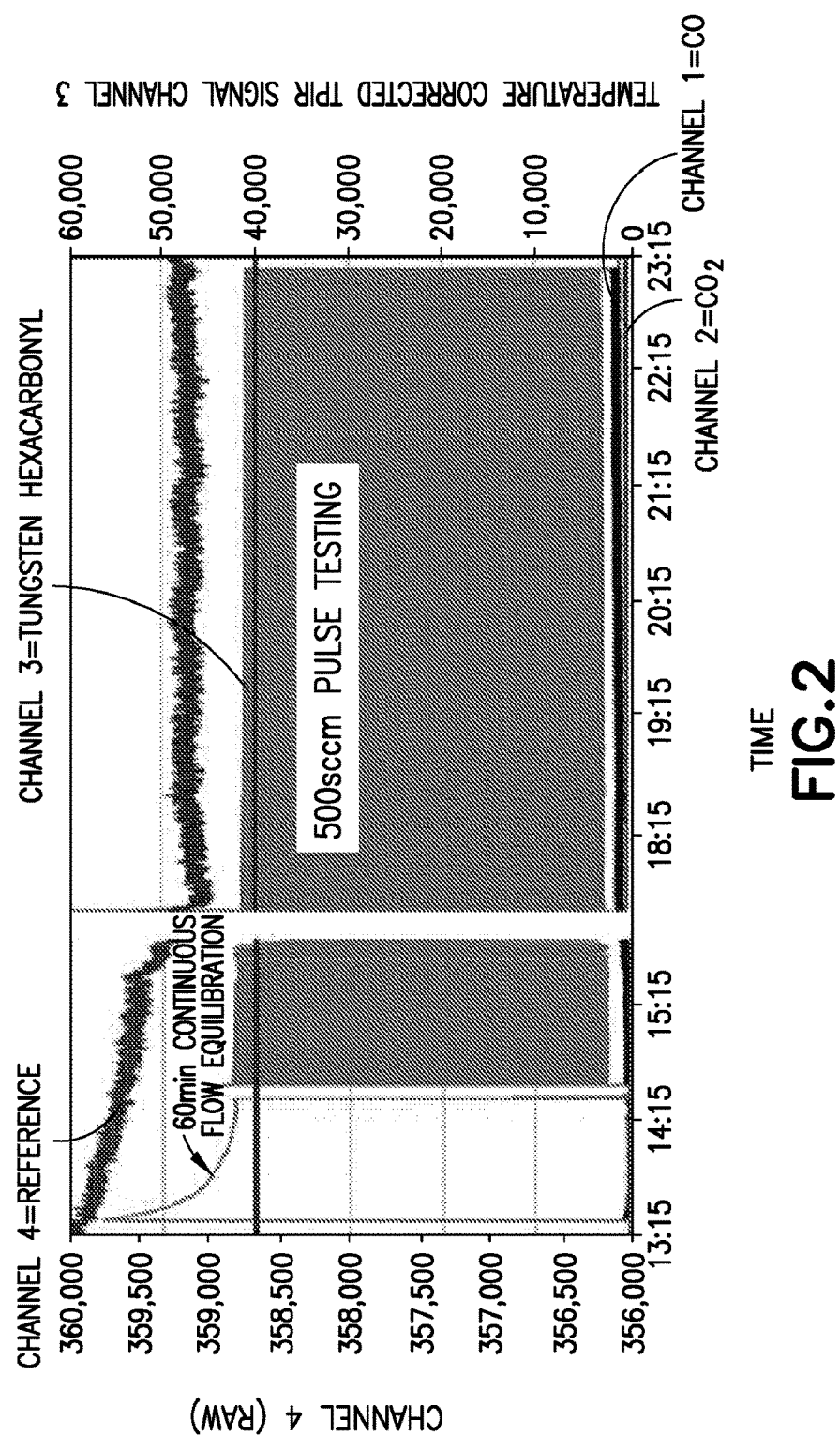
FIG. 2 is a graph of the output of a thermopile infrared (TPIR) detector monitoring an ampoule containing 650 grams of tungsten hexacarbonyl material, wherein detector Channel 1=CO (———) Channel 2=$CO_2$ (———) Channel 3=tungsten hexacarbonyl (·······) and Channel 4=reference (———)

FIG. 2 is a graph of the output of a thermopile infrared (TPIR) detector monitoring such ampoule #1, containing 650 grams of tungsten hexacarbonyl material, wherein Channel 1=CO (———), Channel 2=$CO_2$ (———), Channel 3=tungsten hexacarbonyl (········) and Channel 4=reference (———). The ampoule was heated to 55° C., and argon carrier gas was flowed through the ampoule at a flow rate of 500 standard cubic centimeters per minute (sccm) and pressure of 40 torr, for contacting the tungsten hexacarbonyl solid source material and dispensing from the ampoule of volatilized tungsten hexacarbonyl in the argon carrier gas.

Ampoule #1 was operated with 60 minutes of initial continuous flow equilibration, followed by 500 sccm argon pulse testing, involving repeated cycles of 5 seconds "ON" operation with flow of argon at the specified flow rate, and 10 seconds "OFF" operation with no flow of argon. The TPIR data show a rapid decay in gas-phase concentration within the first hour of testing, which was attributed to more volatile $Mo(CO)_6$ in the particulate solid source material being volatilized in preference to $W(CO)_6$. The particulate solid source material in ampoule #1 was not sintered.

A second vaporizer vessel, denoted NSI ampoule #2, was operated with particulate tungsten hexacarbonyl material that had been recycled multiple times, and having a particle size distribution shown in Table 2 below.

TABLE 2

| Bin Size (mm) | Test 1 (g) | Test 1 (%) | Ave (g) | Ave (%) |
|---|---|---|---|---|
| >1.4 | 5.31 | 13.48 | 5.31 | 13.48 |
| 1.0-1.4 | 7.52 | 19.10 | 7.52 | 19.10 |
| 0.71-1.0 | 8.97 | 22.78 | 8.97 | 22.78 |
| 0.50-0.71 | 6.51 | 16.53 | 6.51 | 16.53 |
| 0.25-0.50 | 8.03 | 20.39 | 8.03 | 20.39 |
| 0.106-0.25 | 2.72 | 6.91 | 2.72 | 6.91 |
| <0.106 | 0.32 | 0.81 | 0.32 | 0.81 |
| | 39.38 | | 39.38 | 100.00 |

The ampoule #2 was operated with 60 minutes of initial continuous flow equilibration, followed by 500 sccm argon pulse testing, involving repeated cycles of 5 seconds "ON" operation with flow of argon at the specified flow rate, and 10 seconds "OFF" operation with no flow of argon.

Figure 3:
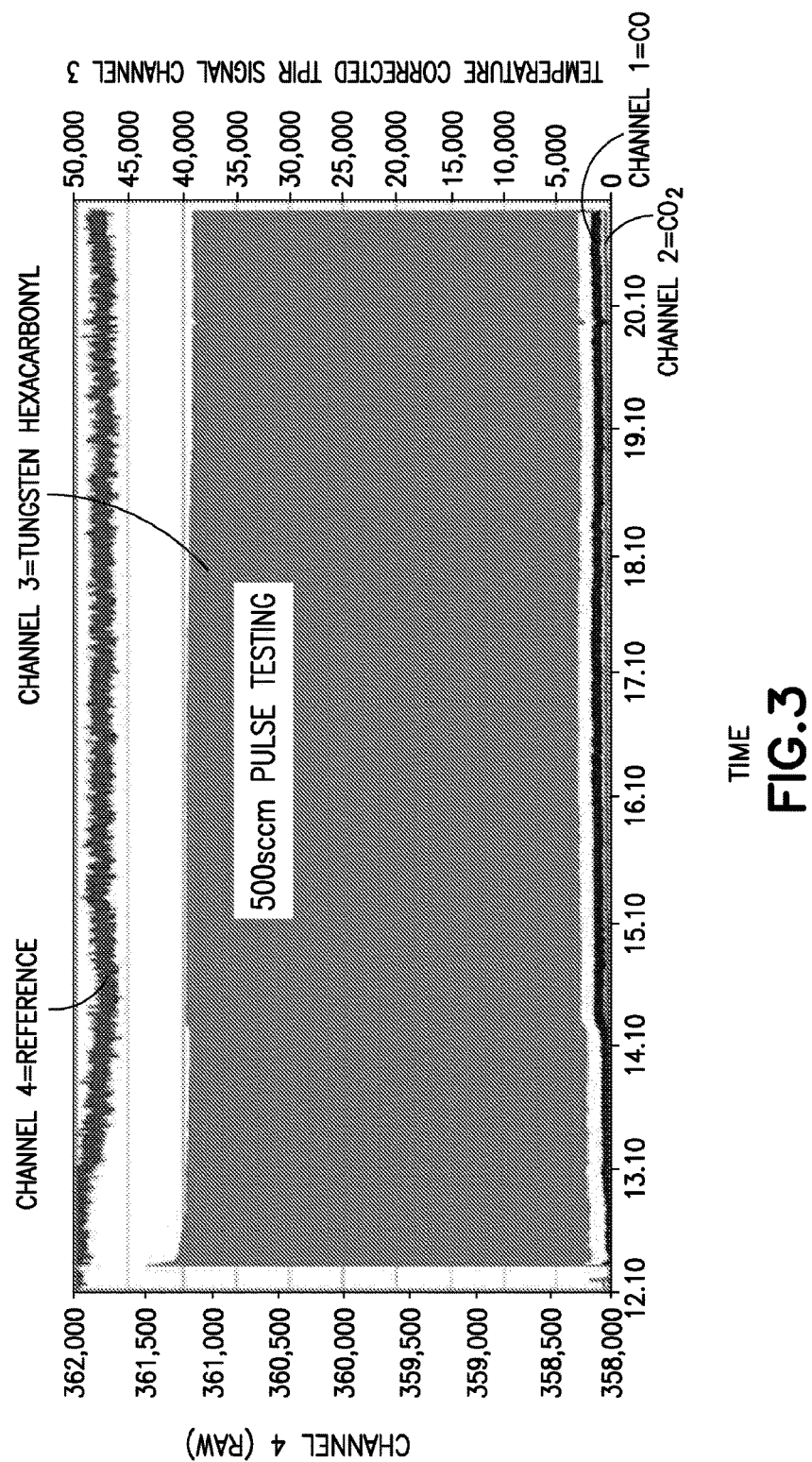
FIG. 3 is a graph of the output of the thermopile infrared (TPIR) detector monitoring another ampoule containing tungsten hexacarbonyl material of lower molybdenum content than that of the FIG. 2 tungsten hexacarbonyl material, wherein detector Channel 1=CO (———). Channel 2=$CO_2$ (———), Channel 3=tungsten hexacarbonyl (·······), and Channel 4=reference (———)

FIG. 3 is a graph of the output of the thermopile infrared (TPIR) detector monitoring ampoule #2 containing tungsten hexacarbonyl material, wherein Channel 1=CO (———), Channel 2=$CO_2$ (———) Channel 3=tungsten hexacarbonyl (········) and Channel 4=reference (———). The ampoule was heated to 55° C., and argon carrier gas was flowed through the ampoule at a flow rate of 500 standard cubic centimeters per minute (sccm) and pressure of 40 torr, for contacting the tungsten hexacarbonyl solid source material and dispensing from the ampoule of volatilized tungsten hexacarbonyl in the argon carrier gas. The material in this ampoule was not sintered.

The data in FIG. 3 show that there was no significant initial drop in tungsten hexacarbonyl concentration, and that the tungsten hexacarbonyl concentration was stable during vapor dispensing operation. Subsequent analysis of the tungsten hexacarbonyl solid source material showed it to contain approximately 320 ppm of molybdenum. The lower molybdenum content was concluded to result in the absence of the large drop in concentration early in the delivery period from the ampoule, as was observed in the operation of ampoule #1.

Figure 4:
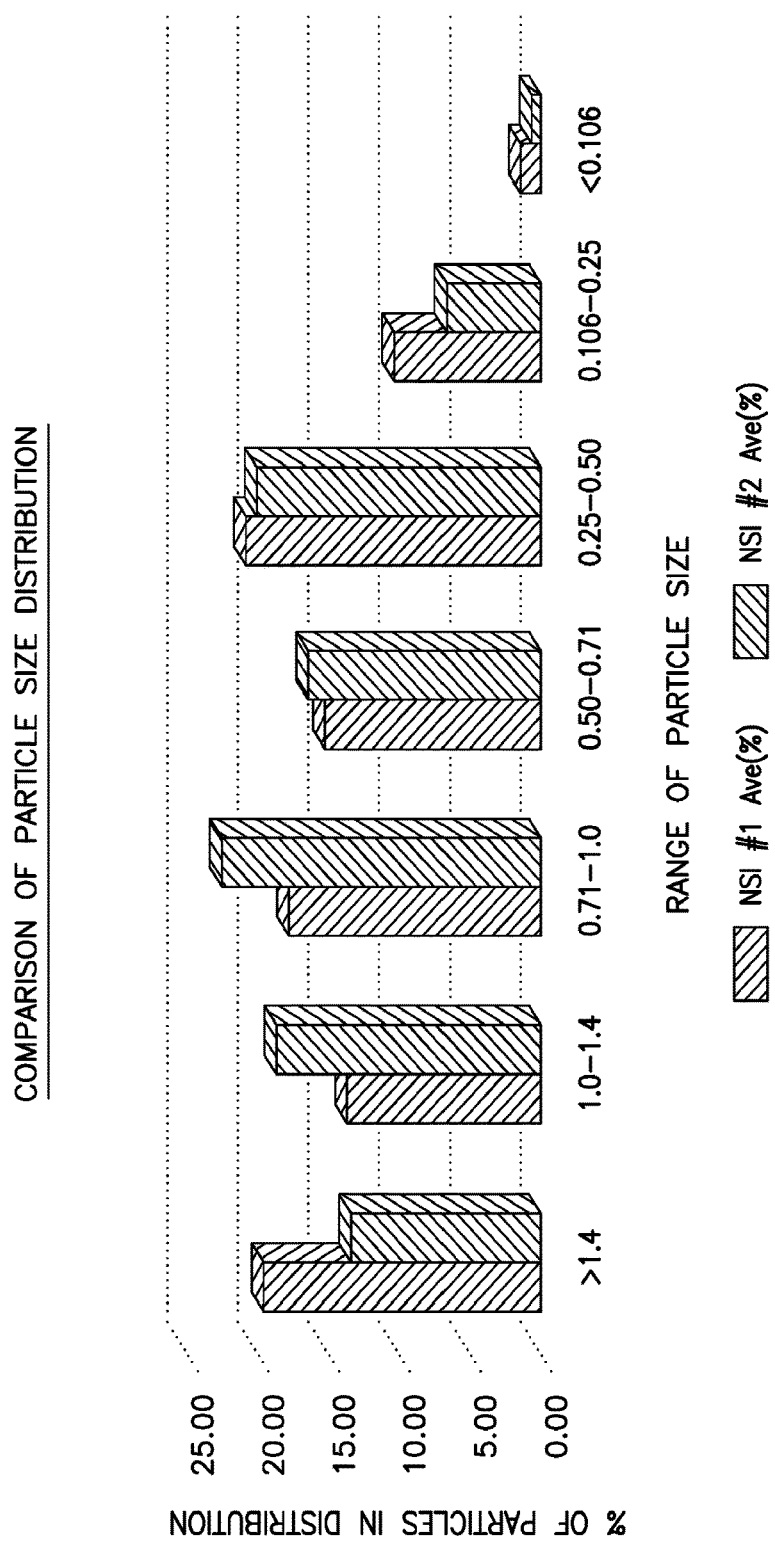
FIG. 4 is a graph of a comparison of particle size distribution, showing the % of particles in the distribution as a function of range of particle size, for various sub-ranges of particle size, in the first ampoule (NSI #1,▩) and the second ampoule (NSI #2, ▩).

FIG. 4 is a graph of a comparison of particle size distribution, showing the % of particles in the distribution as a function of range of particle size, for various sub-ranges of particle size, in the first ampoule (NSI #1,▓) and the second ampoule (NSI #2,▓).

Figure 5:
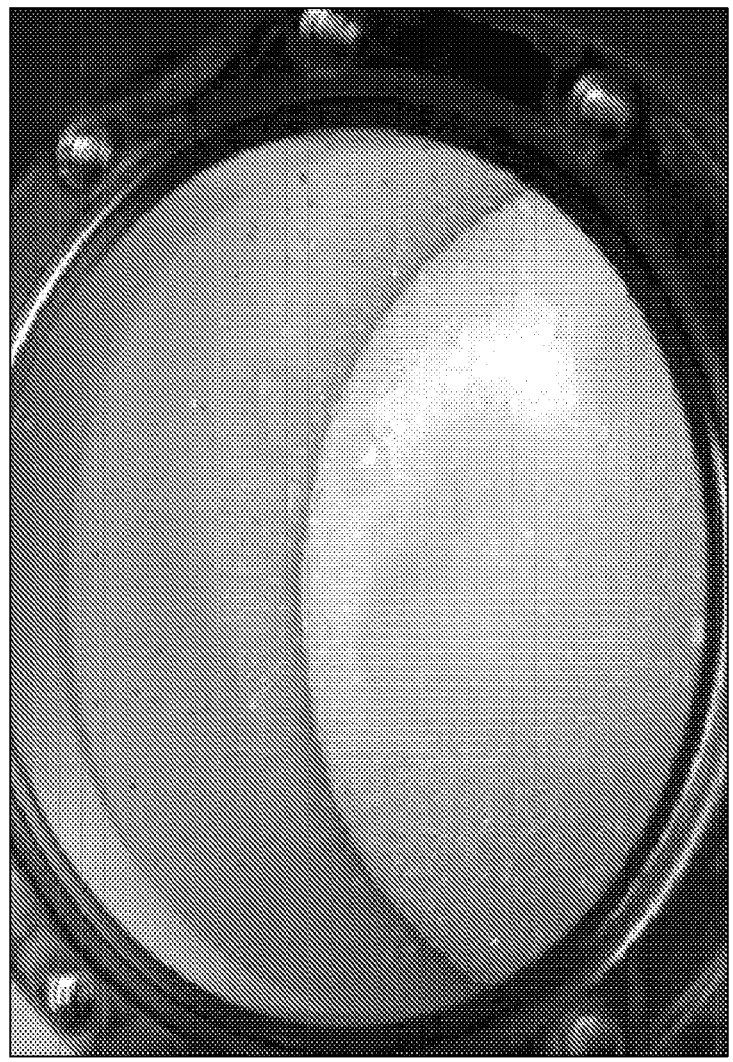
FIG. 5 is a photograph of sintered tungsten hexacarbonyl material after 72 hours of heating at 55° C. in an ampoule, showing a single solid mass formed in situ in the ampoule.

FIG. 5 is a photograph of sintered tungsten hexacarbonyl material after 72 hours of heating at 55° C. in an ampoule, showing a single solid mass formed in situ in the ampoule. The solid almost appears melted although well below the melting point of the material. This material is a hard solid mass after sintering and can be broken into large pieces under significant force. The advantages of the sintered mass include the provision of a uniform surface area for vaporization of the precursor, reduced formation of carrier gas-borne particles, more uniform delivery of solid source material vapor to the downstream tungsten deposition process chamber, and less movement upon shipping of the sintered material in the ampoule.

The particle size distribution of the raw particulate tungsten hexacarbonyl solid source material is important for determining the time and temperature for sintering the raw particulate solid source material. Smaller sized particles sinter more rapidly, and sintering is advantageously carried out at temperature below 100° C., although any suitable temperature and time may be employed to produce the sintered solid source material.

The tungsten hexacarbonyl solid source material of the present disclosure has a molybdenum content of less than 1000 ppm, to achieve advantageous early phase delivery of solid source material vapor without excessive drop in concentration of tungsten hexacarbonyl in the generated vapor from such material, as well as stable operation in respect of uniform delivery and repeatability of the associated vapor deposition process, e.g., atomic layer deposition (ALD) or chemical vapor deposition (CVD).

Molybdenum is a native contaminant of tungsten that is characteristically present in tungsten ores as mined, and tungsten and molybdenum hexacarbonyls are produced during the carbonylation process. It has not heretofore been appreciated that even trace amounts of molybdenum can be highly detrimental in tungsten vapor deposition processes. Accordingly, the tungsten hexacarbonyl solid source material of the present disclosure achieves a substantial advance in the art of tungsten metallization processes.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A solid source material for forming a tungsten-containing film by vapor deposition, which is a sintered tungsten hexacarbonyl consolidated from particulate tungsten hexacarbonyl at a temperature below 100° C., wherein the solid source material has a content of molybdenum that is less than 1000 ppm.

2. The solid source material of claim 1, wherein the content of molybdenum is less than 300 ppm.

3. The solid source material of claim 1, wherein the content of molybdenum is less than 10 ppm.

4. The solid source material of claim 1, wherein the particulate tungsten hexacarbonyl is a particulate of particles of size less than 5 mm.

5. The solid source material of claim 4, wherein particles of size greater than 1.4 mm are less than 15% of the particles.

6. The solid source material of claim 4, wherein particles of size 0.25 mm to 1.4 mm are at least 50% of the particles.

7. The solid source material of claim 4, wherein particles of size 0.25 mm to 1.4 mm are at least 70% of the particles.

8. The solid source material of claim 4, wherein at least 80% of the particles are particles of size below 0.25 mm.

9. A process for forming a solid source material for forming a tungsten-containing film by vapor deposition, comprising:
 providing particulate tungsten hexacarbonyl raw material of particles of size less than 5 mm, wherein particles of size greater than 1.4 mm are less than 15% of the particles, and wherein content of molybdenum is less than 1000 ppm; and
 sintering the particulate tungsten hexacarbonyl raw material at temperature below 100° C. to produce the solid source material for forming a tungsten-containing film by vapor deposition, as a sintered solid.

10. The process of claim 9, wherein the sintering comprises cold sintering.

11. The process of claim 9, wherein content of molybdenum in the particulate tungsten hexacarbonyl raw material is less than 300 ppm.

12. The process of claim 9, wherein content of molybdenum in the particulate tungsten hexacarbonyl raw material is less than 10 ppm.

13. The process of claim 9, wherein particles of size 0.25 mm to 1.4 mm are at least 50% of the particles.

14. The process of claim 9, wherein particles of size 0.25 mm to 1.4 mm are at least 70% of the particles.

15. A method of forming a tungsten-containing film on a substrate, comprising volatilizing a solid source material as claimed in claim 1, to form a tungsten solid source material vapor, and contacting the tungsten solid source material vapor with a substrate under vapor deposition conditions, to form the tungsten-containing film on the substrate.

16. The method of claim 15, wherein the contacting is carried out at temperature below 200° C.

17. The method of claim 15, wherein the contacting is carried out at temperature below 100° C.

18. A tungsten solid source material supply package, comprising a vessel containing a solid source material as claimed in claim 1.

* * * * *